United States Patent
Hoetzel et al.

(10) Patent No.: US 7,154,321 B2
(45) Date of Patent: Dec. 26, 2006

(54) DIGITAL DELAY LINE

(75) Inventors: Juergen Hoetzel, Florstadt (DE); Guenther Kirchhof-Falter, Seeheim-Jugenheim (DE); Hermann Meuth, Rossdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/485,599

(22) PCT Filed: Dec. 11, 2002

(86) PCT No.: PCT/DE02/04539

§ 371 (c)(1), (2), (4) Date: Jan. 29, 2004

(87) PCT Pub. No.: WO03/073615

PCT Pub. Date: Sep. 4, 2003

(65) Prior Publication Data

US 2004/0239396 A1    Dec. 2, 2004

(30) Foreign Application Priority Data

Feb. 27, 2002    (DE) .............................. 102 08 618

(51) Int. Cl.
*H03H 11/26*    (2006.01)

(52) U.S. Cl. ...................... 327/276; 327/277; 327/279

(58) Field of Classification Search ................ 327/156, 327/159, 160, 161, 276, 277, 279
See application file for complete search history.

(56) References Cited

U.S. PATENT DOCUMENTS

| 4,429,310 | A |   | 1/1984 | Zscheile, Jr. et al. ........ 342/145 |
| 4,796,225 | A |   | 1/1989 | Benkara et al. ............... 365/75 |
| 5,033,067 | A | * | 7/1991 | Cole et al. .................... 377/54 |
| 5,381,444 | A | * | 1/1995 | Tajima ....................... 375/141 |
| 5,916,695 | A |   | 6/1999 | Fister et al. ................. 428/647 |
| 5,933,035 | A | * | 8/1999 | Bezzant et al. ............. 327/116 |
| 6,040,067 | A |   | 3/2000 | Sugawara et al. ........... 428/647 |
| 6,118,298 | A |   | 9/2000 | Bauer et al. .................. 326/39 |
| 6,259,651 | B1 | * | 7/2001 | Leung ........................ 365/233 |
| 6,346,839 | B1 | * | 2/2002 | Mnich ........................ 327/158 |

FOREIGN PATENT DOCUMENTS

| EP | 0 631 391 | 12/1994 |
| JP | 63 079414 | 8/1998 |
| JP | 10-302867 | 11/1998 |

* cited by examiner

*Primary Examiner*—Quan Tra
*Assistant Examiner*—An T. Luu
(74) *Attorney, Agent, or Firm*—Kenyon & Kenyon LLP

(57) ABSTRACT

A digital delay line including a first feedback delay line having a first number of interlinked first delay elements, at least one second feedback counter having a second number of second interlinked counting elements, the counting elements being clocked by one of the first delay elements.

2 Claims, 8 Drawing Sheets

DIGITAL DELAY LINE

FIELD OF THE INVENTION

The present invention relates to the field of digital delay lines, particularly for use for radar-based distance measurements and relative-speed measurements from a vehicle.

BACKGROUND INFORMATION

As to the use of analog delay lines for radar sensors, one such delay line is made up of a number of discrete components. Charging times and discharging times of capacitors or coils are used in a complicated interconnection for producing the delay.

Also available is a digital delay line having a constant delay, which has drivers connected in series. Such a digital delay line may be integrated on a semiconductor or may be assembled using a plurality of integrated circuits. FIG. 1 shows such a delay line.

The delay line in FIG. 1 is made up of drivers 1, 2, 3, 4, as well as further drivers which are connected in series. Each of the drivers has a delay time of Δt. After passing through a series connection of n-drivers, a time delay of n*Δt is therefore achieved. The disadvantage here is that, because of the great number of drivers necessary, a correspondingly large silicon surface is needed. The use of such delay lines may therefore be limited to pulse radar systems for aviation and space flight, as well as military applications.

SUMMARY OF THE INVENTION

An object of the exemplary embodiment and/or exemplary method of the present invention is to provide an improved digital delay line, particularly for use for radar-based distance measurements and/or relative-speed measurements from a vehicle.

One advantage of the exemplary embodiment and/or exemplary method of the present invention is that, because of the recursive formation of a digital delay line according to the present invention, substantially fewer delay elements, and therefore a substantially smaller silicon surface are necessary. For example, this allows for the integration of a digital delay line of the exemplary embodiment and/or exemplary method of the present invention on an integrated circuit, e.g. an application specific integrated circuit (ASIC), with a considerable reduction in production costs. The exemplary embodiment and/or exemplary method of the present invention thereby opens up further fields of application for radar-based distance measurements and relative-speed measurements, particularly in the field of automotive electronics.

According to one exemplary embodiment of the present invention, the delay is adjustable within a predefined range, and specifically advantageously in linear fashion, the quantization being given by the delay time of a single one of the delay elements used.

A further special advantage is the scaling ability, that is, if greater delay times are needed, this may be achieved by adding a further feedback delay line. This should be achievable without development expenditure and without reducing the accuracy.

Another advantage may be that the adjustable delay range may be set independently of the resolution of the individual gate delay times. This means that one no longer has to rely on the switching hysteresis of a digital gate for representing the entire delay range. Rather, the exemplary embodiment and/or exemplary method of the present invention allows for the realization of a delay time of, in principle, any length by the cascading of feedback counters. The individual counters are made up, for example, of series-connected, standardized logic gates such as shift registers. In this manner, parasitic effects are not applicable, such as, for example, nonlinearities when using an analog delay line, which are otherwise caused by the use of the switching hysteresis.

According to another exemplary embodiment of the present invention, an "in-system calibration" is carried out or performed to thus automatically make an inexpensive adjustment. This may also be an important advantage, particularly for applications in the field of automotive electronics.

DETAILED DESCRIPTION

Figure 1:
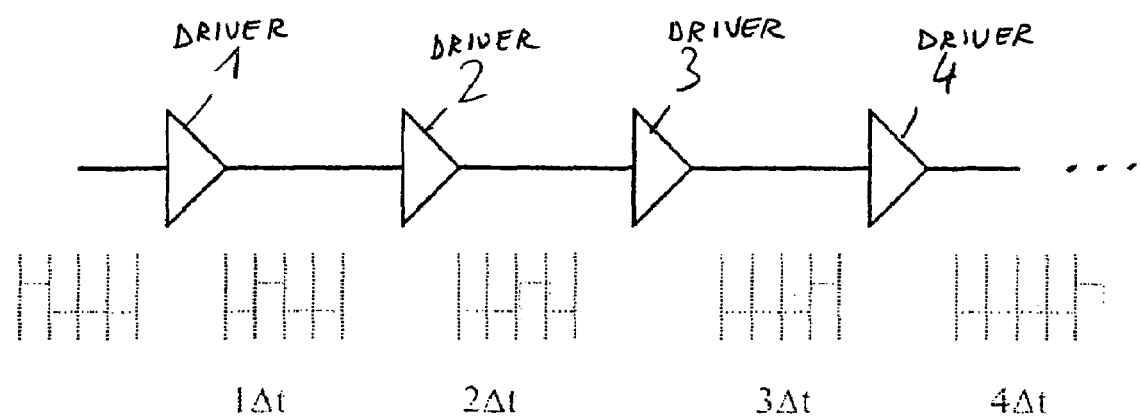
FIG. 1 shows an available delay line, from the related art, having a constant delay time.
Figure 2:
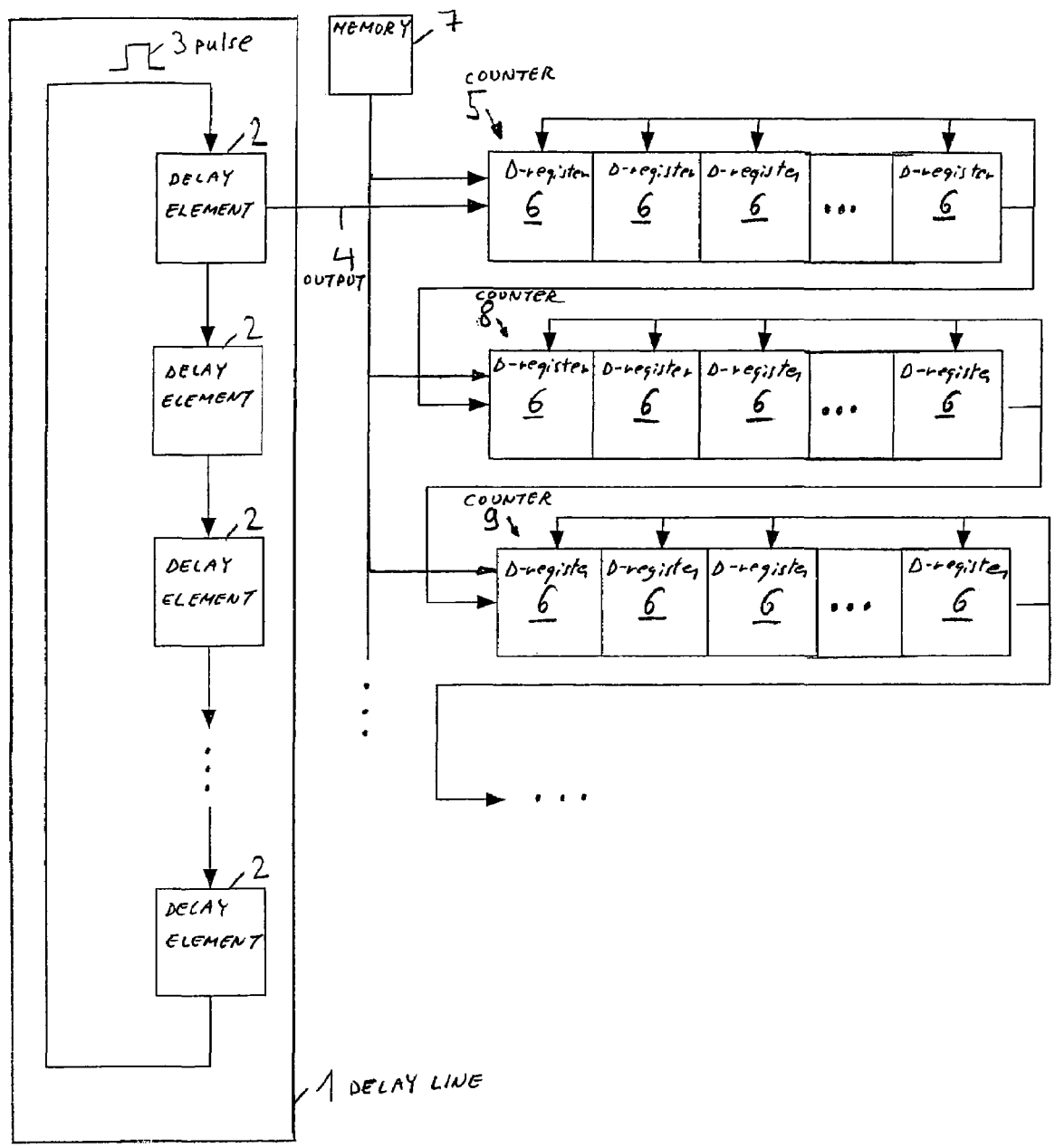
FIG. 2 shows a block diagram of an exemplary embodiment of a digital delay line according to the present invention.

FIG. 2 shows a block diagram of a digital delay line. The digital delay line includes a delay line 1 having a number of delay elements 2. The number of delay elements is, for example, eight, or may be another power of two.

Delay elements 2 may be logic gates, each having a gate delay time of Δt. Delay elements 2 are interconnected to form a ring. To travel through the ring formed by delay line 1 one time, a pulse 3 requires a time of n*Δt, if a number of n delay elements 2 is provided. At the same time, time Δt is the smallest adjustable delay increment.

One of delay elements 2 has an output 4. Output 4 is connected to the clock input of a counter 5. Counter 5 is made up of logic gates connected in series. In the specific embodiment in FIG. 2, they are so-called D-registers 6. Counter 5 is thus a chain of shift registers. Output 4 is in each case connected to the clock inputs of D-registers 6. The D-input of first D-register 6 of counter 5 is also connected to a memory 7, in which the logical value one is stored. The travel time through one D-register 6 is less than the cycle time of delay line 1.

The output of last D-register 6 of counter 5 is fed back to the reset inputs of all D-registers 6 of counter 5. The reset pulse takes place synchronously with a cycle time of delay line 1.

The digital delay line in FIG. 2 also includes further counters 8, 9, . . . As a general matter, further counters 8, 9, . . . have the same or essentially the same construction as counter 5. The output of last D-register 6 of counter 5 is used for clocking subsequent counter 8. The data input of first D-register 6 of counter 8 is in turn connected to memory 7, so that the logical value one is clocked into counter 8 upon reception of a clock signal from the output of last D-register 6 in counter 5.

It is also a corresponding case for counter 9, which receives the output of last D-register 6 of counter 8 as a clock signal. In this way, the entire delay line can cascade.

During operation of the digital delay line, pulse 3 runs constantly through delay line 1. In so doing, pulse 3 is delayed by each delay element 2 of delay line 1 by time interval $\Delta t$. Therefore, a clock signal is available at output 4 after time intervals $n*\Delta t$ if delay line 1 contains a number of n delay elements 2.

The result of this clock signal is that, at point of time $n*\Delta t$, the logical value one is clocked into first D-register 6 of counter 5. Thus, if the number of D-registers 6 in counter 5 is likewise n, the logical value one reaches last D-register 6 of counter 5 after a time interval of $n*n*\Delta t$.

At this point of time, logical value one is clocked into first D-register 6 of counter 8, since the output of last D-register 6 of counter 5 is used as the clock output for counter 8. At the same time, D-registers 6 of counter 5 are reset.

The logical value one then travels through counter 8 up to last D-register 6 of counter 8 within a time interval of $n*n*n*\Delta t$. The case is corresponding for counter 9, which is traversed by the logical value one after time interval $n*n*n*n*\Delta t$.

By cascading further counters, in this way delays of any length may be achieved without this being associated with a loss in accuracy.

For a delay line having 512 delay increments, 512 delay elements are thus not needed, as in the related art, but rather, for example, only n=8 delay elements for the first delay line and two cascaded counters. Thus, instead of 512 delay elements, only a total of 24 elements are needed.

Figure 3:
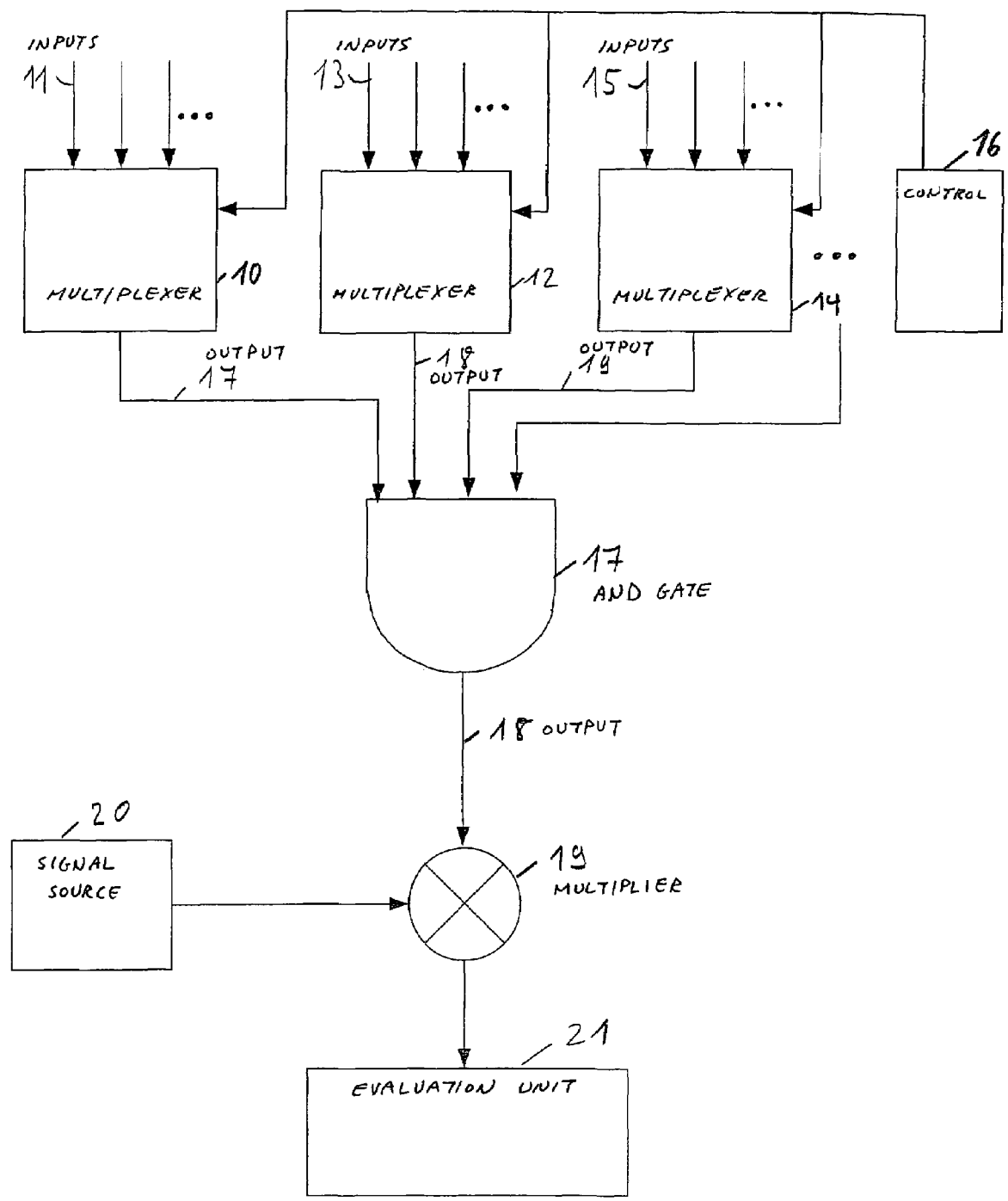
FIG. 3 shows a block diagram for the setting of the delay time.

A further advantage is that the expenditure from the standpoint of circuit engineering for the signal taps of the delay elements and counting elements is also reduced accordingly. Each output of an element may be linked to a multiplexer terminal, so that an adjustable delay time of the digital delay line is able to be queried. FIG. 3 shows a suitable circuit:

The circuit in FIG. 3 contains a multiplexer for each of the delay lines of the circuit in FIG. 2. Multiplexer 10 is connected with its inputs 11 in each case to an output of one of delay elements 2 of delay line 1. The case is corresponding for multiplexer 12, which is connected with its inputs 13 to the outputs of D-registers 6 of counter 5.

It is the same for multiplexer 14, whose inputs 15 are connected to D-registers 6 of counter 8, as well as for further multiplexers, not shown in FIG. 3 for the sake of clarity, which in each case are allocated to a further counter 9, . . . Thus, each delay element of each of the cascaded delay lines and counters is connected to an input of the multiplexer assigned to the respective line.

Multiplexers 10, 12, 14, . . . are controlled by a control 16. The desired delay time may be set via control 16.

Outputs 17, 18, 19, . . . of multiplexers 10, 12, 14, . . . are linked to the inputs of an AND gate 17. AND gate 17 has an output 18 which assumes the value logical one as soon as the delay time set via control 16 has been reached.

For example, to set a delay time of $150*\Delta t$, the output of sixth delay element 2 of delay line 1, the output of second D-register 6 of counter 5 and the output of second D-register 6 of counter 8 are selected, from which the total delay time of $150*\Delta t$ is yielded from $6\Delta t + 16\Delta t + 128\Delta t$. In this way, for example, 512 delay increments may be set in a stepless manner using only 24 elements.

Output 18 of AND gate 17 is connected to a multiplier 19. The other input of multiplier 19 is connected to a signal source 20. The output of multiplier 19 is connected to evaluation unit 21. To determine whether signal source 20 emits a signal after a certain delay time, the procedure is as follows:

The outputs of delay elements 2 and 6, respectively, of the digital delay lines are selected via control 16 in accordance with the delay time of interest. If signal source 20 emits the signal after the delay time has elapsed, the result of the multiplying by multiplier 19 will be logical one; if the opposite is the case, that is, if the signal source either emits no signal or does so at an earlier or later point of time, then the output of multiplier 19 remains logical zero.

This information is evaluated by evaluation unit 21, for example, for the purpose of measuring the distance and/or differential speed. This is explained in greater detail below.

Figure 4:
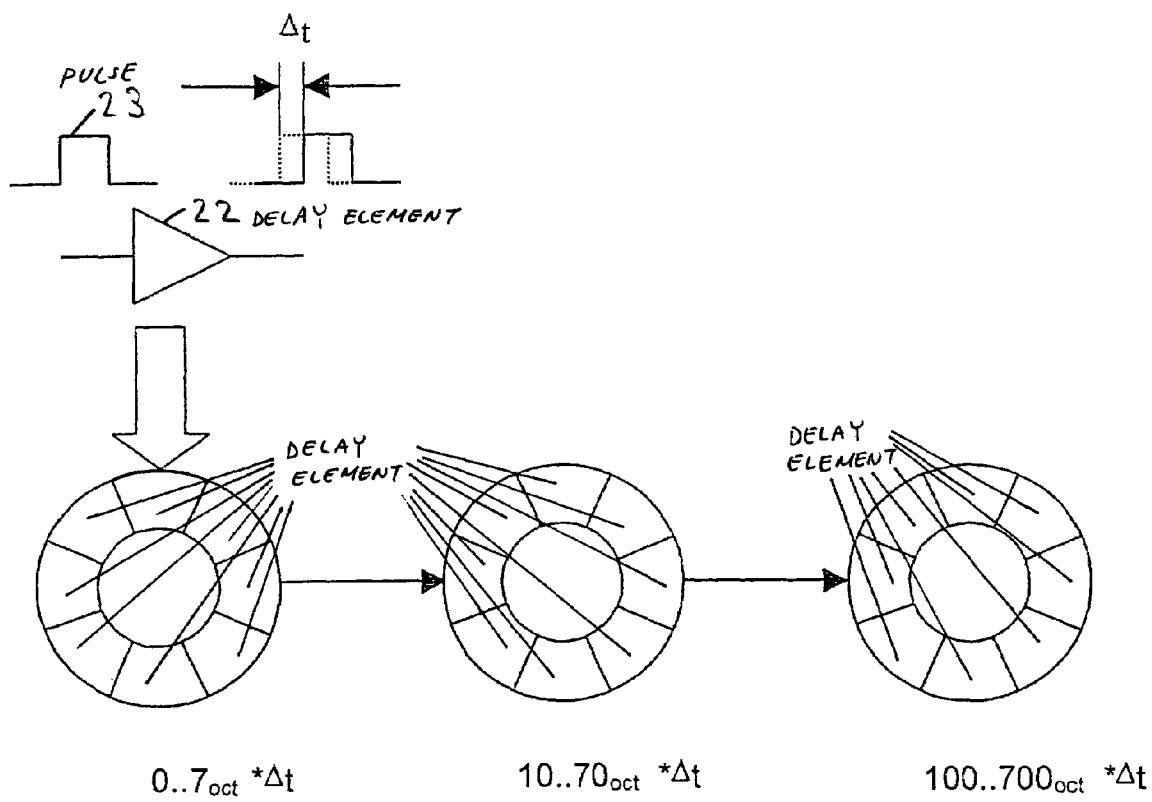
FIG. 4 shows a diagram for illustrating the cascading of delay lines.

FIG. 4 again illustrates the method of operation of a digital delay line according to the present invention. In the exemplified case considered, the digital delay line is made up of three cascaded delay lines/counting lines, having in each case eight delay elements. The first delay line has delay elements 22, each having a gate delay time of $\Delta t$. A single circulation of a pulse 23 through the feedback ring delay line formed by delay elements 22 therefore requires a time duration of $8*\Delta t$.

The counting line downstream of this delay line is therefore clocked at time intervals of $8*\Delta t$. The circulation of a pulse through this downstream counting line thus requires a time duration of $8*8*\Delta t$. For a circulation through the further downstream counting line, a time duration of $8*8*8*\Delta t$ is needed.

Figure 5:
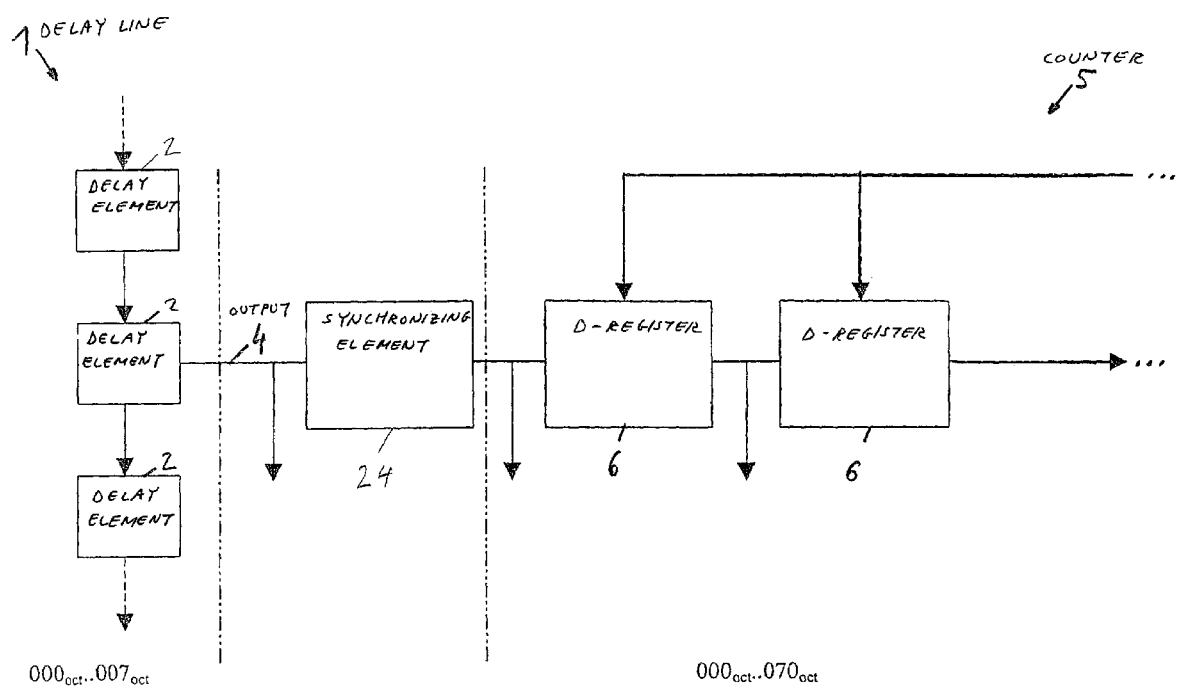
FIG. 5 shows a second exemplary embodiment of a digital delay line.

FIG. 5 shows a further specific embodiment of the invention. Elements of FIG. 5 which correspond to elements of FIG. 2 are identified using the same reference numerals. In contrast to the specific embodiment in FIG. 2, a synchronizing element 24 is located between output 4 of delay element 2 and the input of D-register 6.

Synchronizing element 24 is used to prevent inaccuracies which may develop during the coupling of logical one into counter 5 because of the electrical load of delay element 2. To that end, a pulse travels through delay line 1 once, so that after the first pass, logical one is present via synchronizing element 24 at the input of first D-register 6 of counter 5.

In a subsequent clocking of D-registers 6 of counter 5 via output 4, logical one is then clocked into counter 5, without the electrical loading of delay element 2 occurring at its output 4. Thus, in this exemplary embodiment, to initialize the digital delay line, it is necessary that the pulse first travel once through delay line 1.

Figure 6:
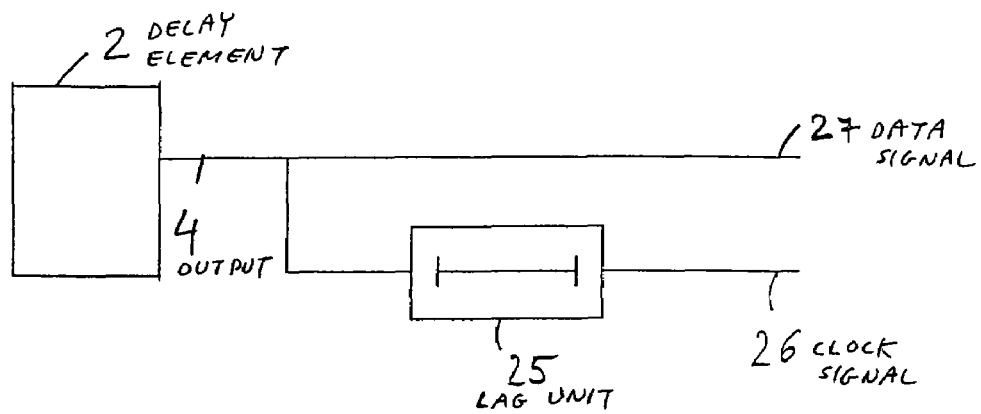
FIG. 6 shows a block diagram for representing the clocking of the shift registers.
Figure 6:
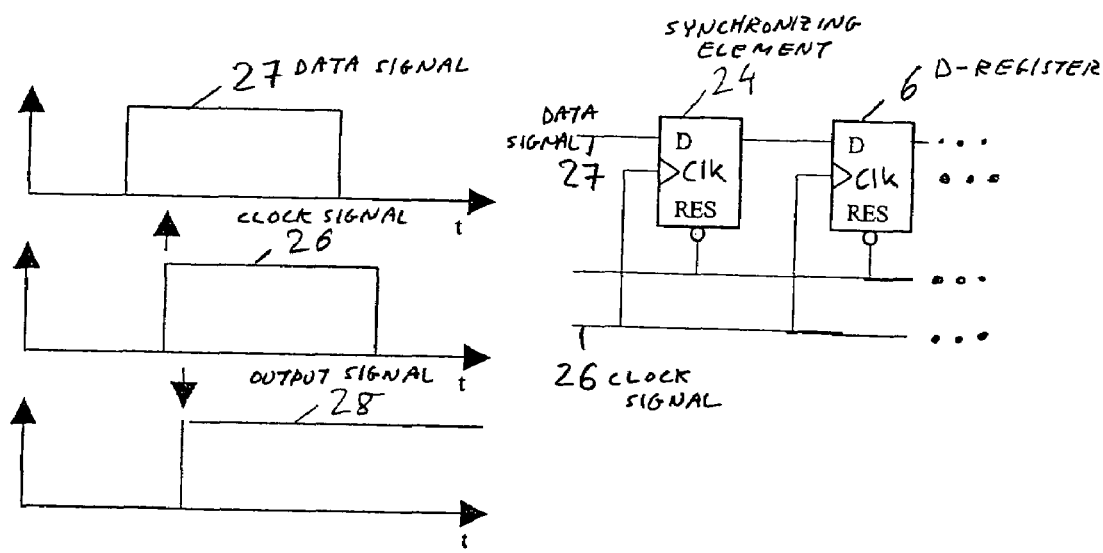

FIG. 6 shows another exemplary embodiment for the interface between delay element 2, output 4 and synchronizing element 24, as well as D-registers 6 of counter 5. A lag unit 25 is located at output 4. The output of lag unit 25 supplies clock signal 26. On the other hand, data signal 27 is present at output 4.

In the exemplary embodiment considered here, synchronizing element 24 and D-registers 6 are implemented by identical gates. Each gate has a data input D, a clock input Clk as well as a reset input RES. Data input D of synchronizing element 24 is associated with data signal 27. Clock input Clk of synchronizing element 24 is associated with clock signal 26.

Data inputs D of D-registers 6 of counter 5 are each connected to the output of preceding D-register 6. First D-register 6 in counter 5, which is shown in FIG. 6, is connected to the output of synchronizing element 24. All the clock inputs of D-registers 6 of counter 5 are associated with clock signal 26.

When a pulse travels through delay element 2, this yields the pattern of data signal 27 shown in FIG. 6. The delay through lag unit 25 yields the pattern of clock signal 26. At the output of synchronizing element 24 is then output signal 28, which at the same time is the input signal for first D-register 6 in counter 5.

After a further circulation of the pulse through delay line 1, a clock signal 26 is emitted once more, so that the logical value one, which is represented by output signal 28, is then clocked directly into counter 5. This procedure is repeated after each resetting of D-registers 6 of counter 5. A memory 7 (see FIG. 2) is thus not needed here.

Figure 7:
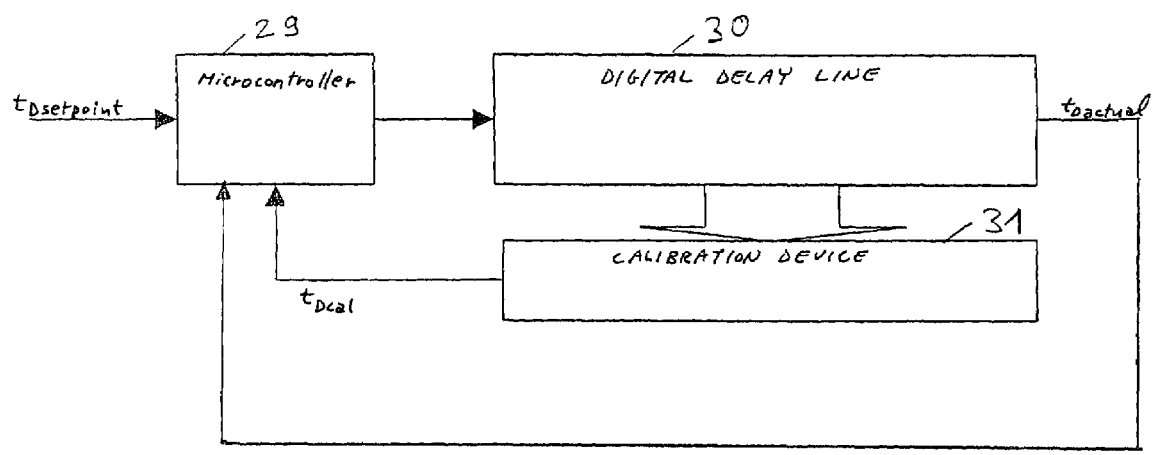
FIG. 7 shows a block diagram of a circuit for the calibration of the digital delay line.

FIG. 7 shows a calibration circuit for the digital delay line. The calibration circuit is made up of a microcontroller 29 which corresponds to control 16 of FIG. 3.

Microcontroller 29 is linked to digital delay line 30, in that microcontroller 29 drives the multiplexers of digital delay line 30 (see multiplexers 10, 12, 13, . . . of FIG. 3).

The calibration circuit also includes a calibration device 31 having a lag element which is used as a reference standard. A delay time of $t_{Dsetpoint}$ is predefined for the calibration. Microcontroller 29 drives the multiplexers of digital delay line 30 accordingly. After time $t_{Dactual}$, the digital delay line then emits a signal. At the same time, calibration device 31 is also started, which emits a signal after time $t_{Dcal}$. From the difference of $t_{Dactual}$ and $t_{Dsetpoint}$, as well as time $t_{Dcal}$, the calibration is then carried out in microcontroller 29.

Figure 8:
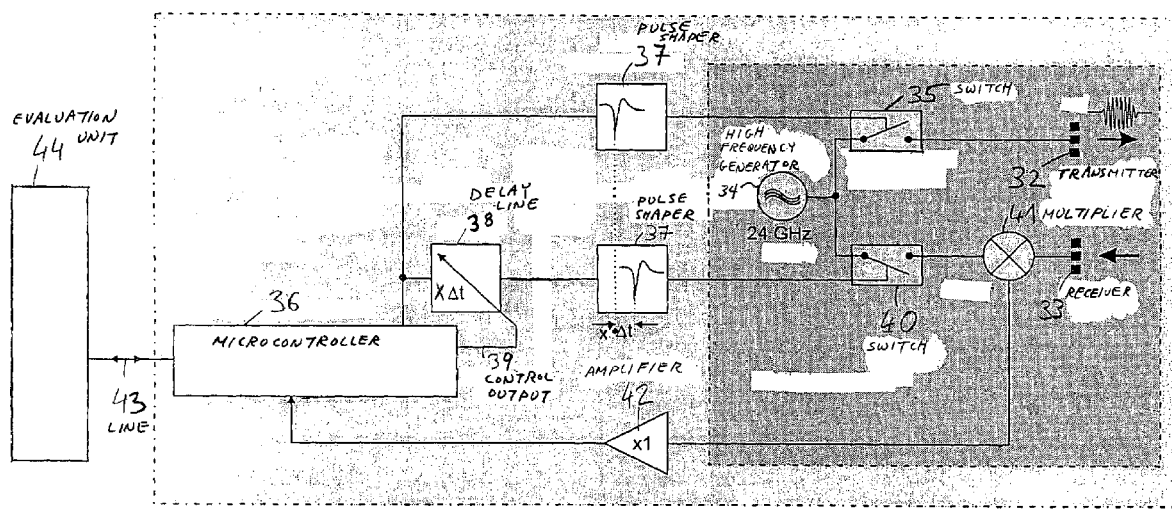
FIG. 8 shows a block diagram of an electronic system having a digital delay line.

FIG. 8 shows a block diagram of an electronic system in which the digital delay line is used. The electronic system includes a transmitter 32 for sending out a high-frequency radar pulse, as well as a receiver 33 for receiving the reflected pulse. The high-frequency signal is supplied by a high-frequency generator 34 that, for example, emits a high-frequency signal having a frequency of 24 GHz. This signal is switched to transmitter 32 when semiconductor switch 35 is closed. Switch 35 is closed by the emission of a signal from microcontroller 36 which reaches the control input of switch 35 via pulse shaper 37.

In the same way, the signal emitted by microcontroller 36 is input into a digital delay line 38 according to the exemplary embodiment and/or exemplary method of the present invention. The delay of delay line 38 is adjustable via control output 39 of microcontroller 36. When a number x of delay increments has been set by microcontroller 36, then, after time duration x*Δt, delay line 38 emits a signal which, via further pulse shaper 37, reaches the control input of further switch 40 and closes it with the time delay of x*Δt after the closing of switch 35.

In this manner, multiplier 41 is connected both to high-frequency generator 34 and to receiver 33. The output of multiplier 41 is connected via amplifier 42 to an input of microcontroller 36. When microcontroller 36 receives a signal from multiplier 41, this means that the reflected pulse has been received by receiver 33 after the propagation time of x*Δt. This means that an object is located at a corresponding distance. This information is transmitted from microcontroller 36 via line 43 to evaluation unit 44.

Microcontroller 36 may drive delay line 38 so that the delay is continually varied for successive high-frequency pulses, in order to cover a specific predefined distance range. Evaluation unit 44 may be used for implementing different applications, such as for ascertaining a relative speed, for initiating an automatic braking procedure when a collision looms, for the so-called adaptive cruise control or for monitoring the blind spot.

The reference numeral list is as follows:

| | |
|---|---|
| delay line | 1; |
| delay element | 2; |
| pulse | 3; |
| output | 4; |
| counter | 5; |
| D-register | 6; |
| memory | 7; |
| counter | 8; |
| counter | 9; |
| multiplexer | 10; |
| input | 11; |
| multiplexer | 12; |
| input | 13; |
| multiplexer | 14; |
| input | 15; |
| control | 16; |
| AND gate | 17; |
| output | 18; |
| multiplexer | 19; |
| signal source | 20; |
| evaluation unit | 21; |
| delay element | 22; |
| pulse | 23; |
| synchronizing element | 24; |
| lag unit | 25; |
| clock signal | 26; |
| data signal | 27; |
| output signal | 28; |
| microcontroller | 29; |
| digital delay line | 30; |
| calibration device | 31; |
| transmitter | 32; |
| receiver | 33; |
| high-frequency generator | 34; |
| switch | 35; |
| microcontroller | 36; |
| pulse shaper | 37; |
| delay line | 38; |
| control output | 39; |
| switch | 40; |
| multiplier | 41; |
| amplifier | 42; |
| line | 43; and |
| evaluation unit | 44. |

What is claimed is:

1. A digital delay line comprising:
    a feedback delay line having a first number of interlinked delay elements;
    at least one feedback counter having a second number of interlinked counting elements, the counting elements being clocked by one of the first delay elements;
    a first multiplexer arrangement for the delay elements whose inputs are coupled to outputs of the delay elements;
    a second multiplexer arrangement for the counting elements whose inputs are coupled to outputs of the counting elements; and
    an AND gate whose inputs are coupled to an output of the first multiplexer arrangement and to an output of the second multiplexer arrangement.

2. The digital delay line of claim 1, wherein the first delay elements include drivers.

* * * * *